US010156770B1

(12) United States Patent
Favalora et al.

(10) Patent No.: US 10,156,770 B1
(45) Date of Patent: Dec. 18, 2018

(54) PACKAGING AND INTERCONNECT SYSTEMS FOR EDGE-EMITTING LIGHT MODULATORS BASED ON SURFACE ACOUSTIC WAVE (SAW) MODULATION

(71) Applicant: The Charles Stark Draper Laboratory, Inc., Cambridge, MA (US)

(72) Inventors: Gregg E. Favalora, Bedford, MA (US); Valerie J. Bloomfield, Melrose, MA (US); Hongmei Zhang, Lexington, MA (US); Anthony Kopa, Somerville, MA (US); Peter H. Lewis, Cambridge, MA (US); Dennis M. Callahan, Wellesley, MA (US); Joseph J. Register, Cambridge, MA (US); Michael G. Moebius, Somerville, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 15/891,828

(22) Filed: Feb. 8, 2018

(51) Int. Cl.
*G02F 1/335* (2006.01)
*H05K 1/02* (2006.01)
*H05K 1/18* (2006.01)
*H05K 3/12* (2006.01)

(52) U.S. Cl.
CPC ........... *G02F 1/335* (2013.01); *H05K 1/0243* (2013.01); *H05K 1/181* (2013.01);
(Continued)

(58) Field of Classification Search
CPC ....... G02F 1/335; G02F 2201/02; H05K 1/02; H05K 1/0243; H05K 1/18; H05K 1/181;
(Continued)

(56) References Cited

U.S. PATENT DOCUMENTS

| 4,635,007 | A | * | 1/1987 | Magill | ..................... H03H 9/42 310/313 D |
| 5,138,687 | A | * | 8/1992 | Horie | .................. G02B 6/12002 385/129 |
| 5,511,142 | A | * | 4/1996 | Horie | .................. G02B 6/12002 385/129 |

(Continued)

OTHER PUBLICATIONS

Google search results re "surface acoustic wave rf trace board" (Year: 2018).*

(Continued)

*Primary Examiner* — Andrew Jordan
(74) *Attorney, Agent, or Firm* — HoustonHogle LLP

(57) ABSTRACT

Packaging and interconnect systems for edge-emitting light modulators are disclosed. Embodiments address the challenge of integrating many edge-emitting modulators such as surface acoustic wave (SAW) modulators together in a single light field generator system. In one example, a proposed light field generator system includes a stack of projector modules and a mounting block having slots. The projector modules preferably have a printed circuit board (PCB) form factor that enables the slots of the mounting block to receive and hold the modules. Each module includes a module board and one or more SAW substrates carried by the module board, and an array of SAW modulators are formed/fabricated within each substrate. Proposed substrate fabrication techniques provide wiring and routing of RF and optical signals to the SAW modulators within each substrate to achieve a density of light modulators suitable for practical application to light field projection systems.

22 Claims, 8 Drawing Sheets

(52) U.S. Cl.
CPC ........ *G02F 2201/02* (2013.01); *H05K 3/1241* (2013.01); *H05K 2201/10083* (2013.01); *H05K 2201/10121* (2013.01); *H05K 2201/10189* (2013.01); *H05K 2201/10287* (2013.01); *H05K 2201/10356* (2013.01); *H05K 2201/10734* (2013.01)

(58) Field of Classification Search
CPC .......... H05K 2201/10083; H05K 2201/10121; H05K 2201/10189; H05K 2201/10287; H05K 2201/10356; H05K 2201/10734; H05K 3/12; H05K 3/1241
See application file for complete search history.

(56) References Cited

U.S. PATENT DOCUMENTS

| | | | | |
|---|---|---|---|---|
| 6,180,252 | B1* | 1/2001 | Farrell | C23C 18/08 428/469 |
| 6,432,472 | B1* | 8/2002 | Farrell | C04B 35/468 427/126.3 |
| 7,163,874 | B2* | 1/2007 | Iwashita | C30B 5/00 438/458 |
| 9,564,650 | B2* | 2/2017 | Harjes | H01M 8/1233 |
| 10,015,477 | B2* | 7/2018 | Grata | G02F 1/33 |
| 2004/0238866 | A1* | 12/2004 | Iwashita | C30B 5/00 257/296 |
| 2016/0286204 | A1* | 9/2016 | Grata | G02F 1/33 |
| 2017/0276020 | A1* | 9/2017 | Lee | F03D 17/00 |
| 2018/0098437 | A1* | 4/2018 | Gray Haley | H01L 23/50 |
| 2018/0120085 | A1* | 5/2018 | Lane | G01B 9/02027 |
| 2018/0133506 | A1* | 5/2018 | Wheeler | A61B 5/0031 |
| 2018/0136389 | A1* | 5/2018 | Wheeler | A61N 5/0601 |
| 2018/0175961 | A1* | 6/2018 | Spector | G02B 6/3526 |
| 2018/0210394 | A1* | 7/2018 | Favalora | H04N 13/305 |
| 2018/0217414 | A1* | 8/2018 | Byrnes | G02F 1/335 |
| 2018/0217473 | A1* | 8/2018 | Frank | G02F 1/335 |

OTHER PUBLICATIONS

Li, C., et al., "Silicon Photonics Packaging with Lateral Fiber Coupling to Apodized Grating Coupler Embedded Circuit," Optical Society of America, 22 (20): 24235-24240 (2014).

"Micro-Lensed Optical Fiber" www.wttechnology.com (2012).

Snyder, B., et al., "Packaging Process for Grating-Coupled Silicon Photonic Waveguides Using Angle-Polished Fibers," IEEE Trans. Components, Packaging and Manufacturing, 3(6): 954-959 (2013).

Taillaert, D., et al., "Grating Couplers for Coupling Between Optical Fibers and Nanophotonic Waveguides," Japan J. App. Phys., 45(8A): 6071-6077 (2006).

Gfeller, F.R., et al., "Colinear Acousto-Optic Deflection in Thin Films," Electronic Letters, 8(22): 549-551 (1972).

Onural, L. et al., "New High-Resolution Display Device for Holographic Three-Dimensional Video: Principles and Simulations," Optical Engineering, 33(3): 835-844 (1994).

Matteo, A.M., et al., "Collinear Guide Wave to Leaky Wave Acoustrooptic Interactions in Proton-Exchanged LiNbO3 Waveguides," IEEE Trans. on Ultrasonic, Ferroelectrics, and Frequency Control, 47(1): 16-28 (2000).

Smalley, D.E., et al., "Anisotropic leaky-mode modulator for holographic video displays," Nature, 498: 313-317 (2013).

McLaughlin, S., et al., Optimized guided-to-leaky-mode device for graphics processing unit controlled frequency division of color, Appl. Opt., 54(12): 3732-3736 (2015).

Hinkov, V.P., et al., "Collinear Acoustooptical TM-TE Mode Conversion in Proton Exchanged Ti:LiNbO3 Waveguide Structures," J. Lightwave Tech., 6(6): 900-08 (1988).

Qaderi, K., et al., "Leaky-mode waveguide modulators with high deflection angle for use in holographic video displays," Opt. Expr., 24(18): 20831-20841 (2016).

Savidis, N., et al., "Progress in fabrication of waveguide spatial light modulators via femtosecond laser micromachining," Proc. of SPIE, 10115: R1-R16 (2017).

Smalley, D.E., et al., Progress on Characterization and Optimization of Leaky-Mode Modulator for Holographic Video, J. Micro./Nanolith. MEMS MOEMS, 14(4): 041308-1-041308-6 (2015).

McLaughlin, S., et al., "Progress on Waveguid-Based Holographic Video," Chinese Optics Letters, 14(1): 010003-1-01003-5 (2016).

Tanaka, S., et al. "Lithium-Niobate-Based Surface Acoustic Wave Oscillator Directly Integrated with CMOS Sustaining Amplifier," IEEE Trans Ultrasonics, Ferroelectrics, and Frequency Control, 59(8), 1800-1805 (Aug. 2012).

* cited by examiner

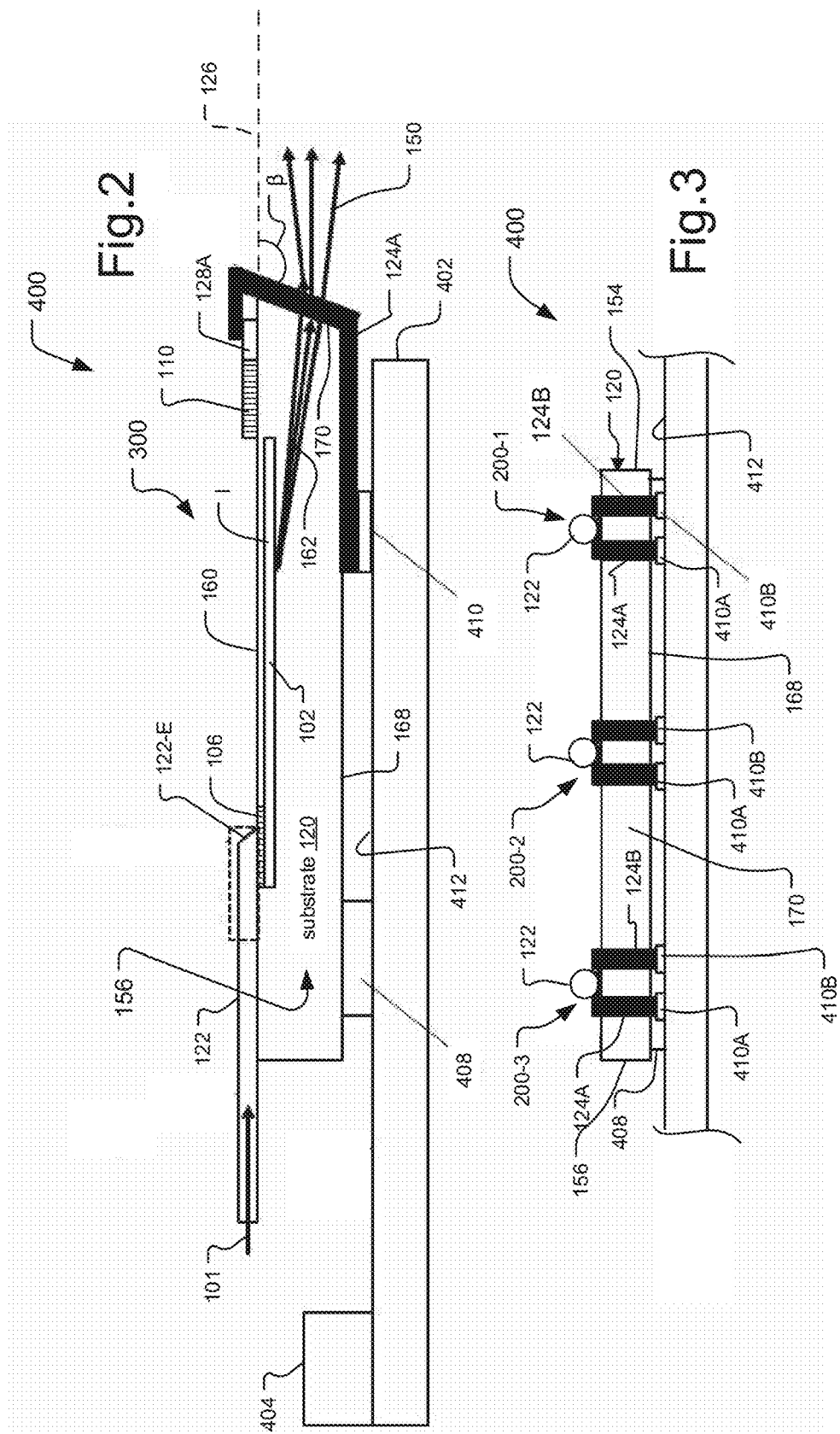

PACKAGING AND INTERCONNECT SYSTEMS FOR EDGE-EMITTING LIGHT MODULATORS BASED ON SURFACE ACOUSTIC WAVE (SAW) MODULATION

BACKGROUND OF THE INVENTION

Surface acoustic wave (SAW) optical modulators are being proposed as an optical engine for three dimensional (3D) display systems. These modulators can provide controllable sub-holograms from which a light field can be constructed.

One type of SAW modulator is the guided-to-leaky-mode device fabricated using lithium niobate as described, for example, in Hinkov et al., *Collinear Acoustooptical TM-TE Mode Conversion in Proton Exchanged Ti:LiNbO3 Waveguide Structures*, J. Lightwave Tech., vol. 6(6), pp. 900-08 (1988), Smalley et al., Anisotropic leaky-mode modulator for holographic video displays, Nature, vol. 498, pp. 313-317 (2013), herein after "Smalley"; McLaughlin et al., *Optimized guided-to-leaky-mode device for graphics processing unit controlled frequency division of color*, Appl. Opt., vol. 54(12), pp. 3732-36 (2015), Qaderi et al., *Leaky-mode waveguide modulators with high deflection angle for use in holographic video displays*, Opt. Expr., vol. 24(18), pp. 20831-41 (2016), hereinafter "Qaderi"; and Savidis et al., *Progress in fabrication of waveguide spatial light modulators via femtosecond laser micromachining*, Proc. of SPIE Vol. 10115, 2017.

In these SAW modulators, a surface acoustic wave diffracts light propagating in a waveguide and causes at least some of the light to change from a guided mode to a leaky mode that exits the waveguide.

SUMMARY OF THE INVENTION

The typical SAW modulator requires relatively high levels of hybrid integration. Light is typically delivered to a SAW modulator using optical fiber that must be coupled to the modulator's substrate. Moreover, an RF signal must also be delivered to the SAW modulator. Different optics may be further required to condition the light exiting from the modulator.

These challenges are compounded when a complete light field projection system must be constructed. Often many, hundreds or more, of the SAW modulators must be integrated together to construct the desired smooth light field.

The present invention concerns the packaging and interconnect systems for light field generator systems. Embodiments address the challenge of integrating many edge-emitting modulators together in a single light field projection system. Some embodiments can address the problem of the arrangement of optical modulators, their optical and electronic inputs, and their optical outputs, at a density suitable for practical application to light field projection systems. The embodiments can further help to reduce the visibility of seams (or "grout") between modulator substrates, and can be amenable to volume manufacturing techniques.

In general, according to one aspect, the invention features a projector module. This comprises one or more surface acoustic wave (SAW) substrates, each having one or SAW modulators including waveguides for transmitting light. The module also comprises a module board carrying the one or more SAW substrates.

In embodiments, the module board has an array of radio frequency (RF) feed lines for providing RF signals to the substrates. These RF traces electrically connect SAW transducers to RF feedlines of the module board.

Additionally, standoff blocks can be used for spacing the SAW substrates from the module board.

In some cases, each of the RF traces extend across several faces of the SAW substrates.

In one implementation, a cable connector, such as a ribbon connector, on the module board receives RF signals for driving the SAW modulators of SAW substrates.

In general, according to another aspect, the invention features a light field generator device. This device comprises a surface acoustic wave (SAW) substrate containing SAW modulators and radio frequency (RF) traces extending across several faces of the SAW substrate to deliver RF signals to transducers of the SAW modulators.

These RF traces can conformally follow the profile of the faces of the SAW substrate. The traces might extend from a distal face of the SAW substrate around edges to a proximal face of the SAW substrate. They might extend over a distal face and/or at least one side face of the SAW substrate.

In general, according to another aspect, the invention features a method for forming radio frequency (RF) traces on a surface acoustic wave (SAW) substrate. This method comprises depositing the traces on the SAW substrate and preventing the traces from stopping light from exiting the SAW substrate.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 2 is a side view of the projector module showing one of the light field generator devices, further showing the light propagating through one if its SAW modulators and exiting from the device;

FIG. 3 is a partial front view of the projector module 400 showing the routing of RF feeds to the SAW transducers of a light field generator device;

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
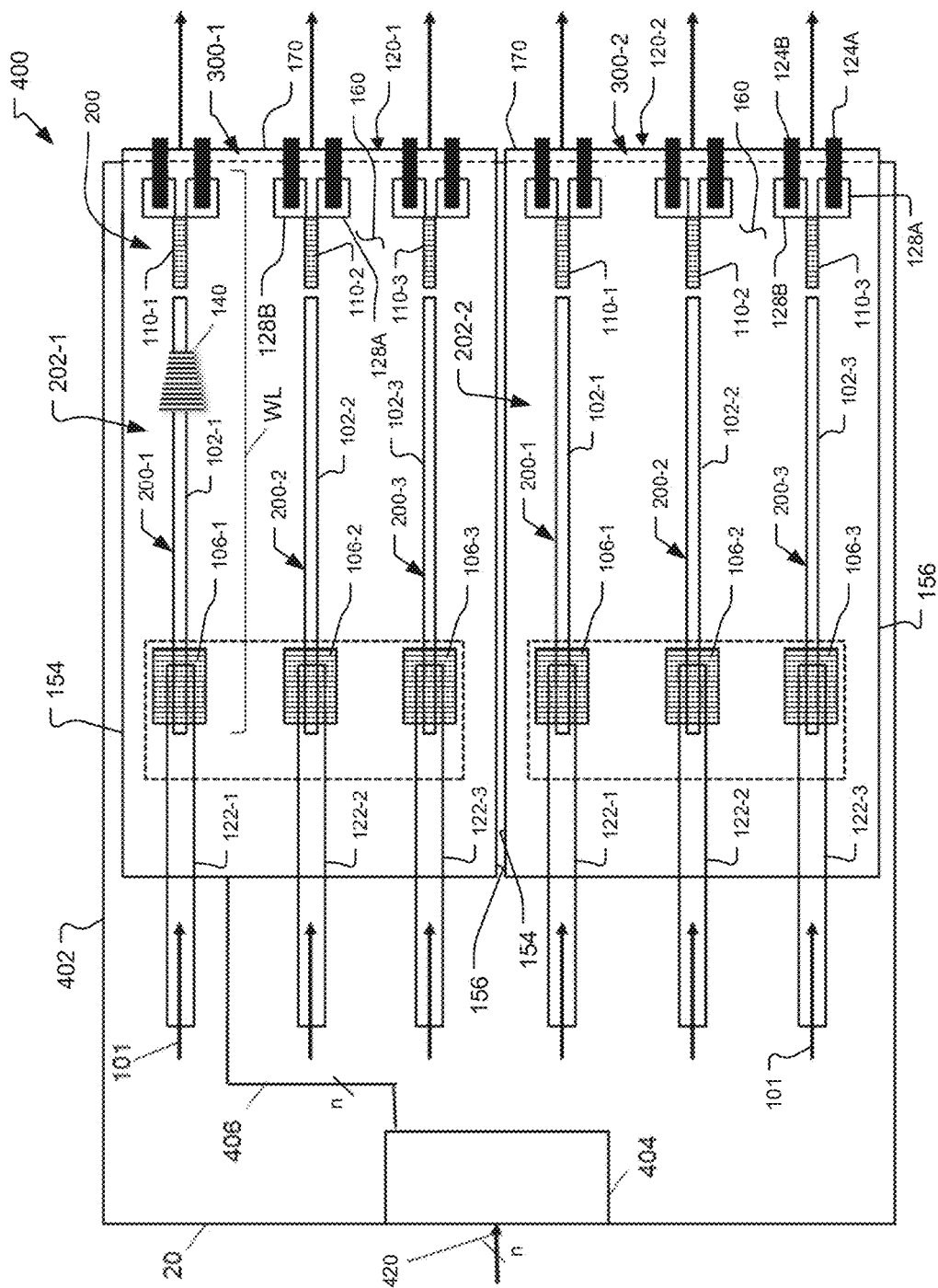
FIG. 1 shows a proximal face of a projector module including two light field generator devices.

FIG. 1 shows a top view of a projector module 400, which has been constructed according to the principles of the present invention.

In the illustrated embodiment, the projector module 400 includes two electro-holographic light field generator devices 300-1 and 300-2. They are located in the projector module 400 side by side with their proximal faces 160 extending parallel to the plane of the figure.

The two electro-holographic light field generator devices 300-1, 300-2 are mounted to a common module board 402 of the projector module 400. A module RF connector 404 is installed on the module board 402 and interfaces with a ribbon umbilical cable 420 that provides one or more RF drive signals. At the common module board 402, the module RF connector 404 then distributes the RF drive signals via an RF feed line network 406.

Each electro-holographic light field generator device 300-1, 300-2 comprises an array 202 of SAW devices or modulators 200. The SAW devices 200 are fabricated in piezoelectric, crystalline, SAW substrates 120-1 and 120-2, respectively. The longitudinal axes of each of these SAW devices 200 extend parallel to each other, across each light field generator device 300. In the specific illustrated embodiment, each light field generator device 300-1, 300-2 includes an array 202 of three (3) SAW devices 200-1, 200-2, 200-3.

Of course, in other embodiments, usually larger numbers of SAW devices 200 are provided in each light field generator device 300 and/or in each SAW substrate 120. In a preferred embodiment, there are at least ten (10) such SAW devices 200 per each light field generator device 300/SAW substrate 120.

Each SAW substrate 120 may be made, for example, of lithium niobate. In the current embodiment, the SAW substrates 120 are x-cut, y-propagating, measuring 5 millimeters (mm) (in the direction of the waveguides 102)×10 mm (in a direction perpendicular to the waveguides 102, but in the plane of the figure)×1 mm (substrate 120 thickness). Many other materials and design choices are available, however, including other piezoelectric materials and crystallographic orientations, and waveguide architectures such as planar, ridge, rib, embedded, immersed, and bulged. Doping such as MgO-doped lithium niobate may be useful, in some cases.

Each SAW optical modulator 200 includes an in-coupling device 106 (e.g., in-coupling grating or prism), a waveguide 102 and a SAW transducer 110 (e.g., an interdigital transducer or IDT, for example).

In the illustrated embodiment, the in-coupling device 106 of each SAW modulator 200 is an in-coupling grating. The grating receives input light 101 carried by an optical fiber pigtail 122 that terminates above the respective grating 106.

There are other ways to couple light into the waveguides 102 of the substrates 120, however. These include buttcoupling to the pigtails 122, free-space illumination, and fiber or free-space coupling into an in-coupling prism.

In a typical design, the waveguides 102 provide confinement of the input light in a TE (transverse electric, E-field in the plane of the device) guided mode. In a current embodiment, the waveguide 102 is 100 micrometers wide (in the plane of the figure) and 1 micrometer thick (perpendicular to the plane of the figure).

The SAW transducers 110 are driven by an RF input signal that creates a corresponding surface acoustic wave 140. The surface acoustic wave 140 counter-propagates collinearly with the light in the waveguide 102. The SAW interacts with the light, both near the proximal face 160, to convert or diffract part of the light to a transverse magnetic (TM) polarization, leaky mode.

Here, the SAW transducers are interdigital transducers that are approximately 1 mm long (i.e., in the direction of the waveguide 102) and have features on the order of 1-3 micrometers. IDT pads 128A, 128B are each roughly 300 micrometers×300 micrometers.

Birefringence of the waveguide 102 and the SAW substrate 120 causes the TM leaky mode portion of the light propagating in the waveguide 102 to leak out of the waveguide 102 into the SAW substrate 120. The leaky mode portion of the light enters the substrate 120 as diffracted light 162, which travels within the substrate 120 towards an exit face. Here, the exit face is an end face 170 of each SAW substrate 120 of each light field generator device 300-1, 300-2.

In different embodiments, the IDT 110 can occupy a variety of specific locations and specific orientations with respect to the waveguides 102. For example, in the illustrated embodiment, the transducers 110 are located near the end face 170 so that the surface acoustic waves 140 will propagate in a direction opposite the propagation of the light in the waveguides 102. In other embodiments, however, the transducers 110 are located near the in-coupling devices 106 so that the surface acoustic waves 140 will co-propagate in the direction of the light in the waveguides 102.

Also, there could be multiple SAW transducers 110 for each in-coupling device 106/waveguide 102. In such an implementation, each SAW transducer 110 might be responsible for a different specific bandwidth around a given center frequency (e.g.: 100-200 MHz, 200-300 MHz, and 300-400 MHz).

In a specific embodiment, the array 202 of SAW optical modulators 200 may be packed relatively tightly with a waveguide separation 206 of between 10 μm-400 μm, for example, 50 μm. The waveguide length WL may be less than a centimeter to several centimeters (e.g., 1 cm) long.

FIG. 2 shows a side view of an exemplary projector module 400. It is also illustrative of the operation of an exemplary SAW modulator 200 of the light field generator device 300. It shows side facets 156 of the SAW substrate 120.

In terms of the SAW modulator operation, the input light signal 101 is carried to the device via the optical fiber pigtail 122. In the illustrated embodiment, end 122-E of the optical fiber pigtail 122 is polished at an angle and preferably metallized or coated with another reflective coating. Thus, the optical signal 101 transmitted by the pigtail 122 is reflected at the end 122-E toward the in-coupling grating 106 of the SAW modulator device 200. As a result, the optical signal is coupled into the waveguide 102 via the grating 106.

In some examples, the optical fiber pigtails 122 are arranged on and bonded to the surface of the substrate 120. In other cases, the pigtails are placed such that they lie on or within trenches formed into the proximal face 160 of the SAW substrate 120.

At the other end of the SAW modulator device 200, the IDT 110 generates the surface acoustic wave 140 that counter propagates with the light in the waveguide 102. When they interact, see point I, the surface acoustic wave 140 diffracts the optical signal 101 to create diffracted light 162 that leaks out of the waveguide 102.

In the illustrated embodiment, the diffracted light 162 exits the substrate 120 via end face 170 as the exit face. An edge cut angle β (beta) of the end face 170 is also shown. The edge cut angle β is measured from a plane 126 of the proximal face 160, to the end face 170. The edge cut angle β is preferably about 100 to 140°, or about 120°. As a result, when the diffracted light 162 exits the substrate 120 into air, for example, the edge cut angle β in combination with the refraction at this interface causes the exit light 150 to propagate in a direction that is generally parallel to the longitudinal axes of the SAW devices 200 and parallel to the plane 126 of the proximal faces 160 of those devices 200.

Exit optics are typically further used. Their purpose includes angle magnification, polarization, and elliptical diffusing. The optics can be separate from the substrate 120 or fabricated on the end face 170, in examples.

In terms of the construction of the projector module 400, the SAW substrate 120 is attached to a top face 412 of the module board 402. In the illustrated implementation, the rear end of the substrate 120 can be separated from the top face 412 of the module board 402 via an optional rear standoff block 408. On the other hand, the front end of the substrate 120 is separated from the top face 412 of the module board 402 via a series of front conductive blocks or pads 410.

In addition to supporting the front end of the substrate 120, the front conductive blocks 410A, 410B are also utilized in the delivery of the RF signals to the IDTs 110 of the SAW devices 200. In more detail, the RF signals from the RF connector 404 are routed over the top face 412 or through layers of the module board 402 in the RF feed line network 406 of the module board 402 and to the front standoff blocks 410, which are electrically conducting. Pairs of conformal RF traces 124A and 124B electrically connect to respective front standoff blocks 410A, 410B. The conformal RF traces 124A and 124B then extend forward, on the distal face 168 of substrate 120 and then wrap around the edge to the end face 170, and extend over the end face 170 to the proximal face 160. On the proximal face, the conformal RF traces 124A, 124B run rearward to make contact with respective IDT bond pads 128A, 128B that connect with the IDT 110.

FIG. 3 shows a front view of the projector module 400. It best illustrates how each SAW device 200-1, 200-2, 200-3 of the SAW substrate 120 has a pair of conformal RF traces 124A, 124B that wrap-around the end face 170 to carry the RF signal for each IDT 110 from the respective front conductive blocks 410A, 410B on the bottom of the substrate 120 to the IDT 110 on the top of the substrate 120.

Figure 4A:
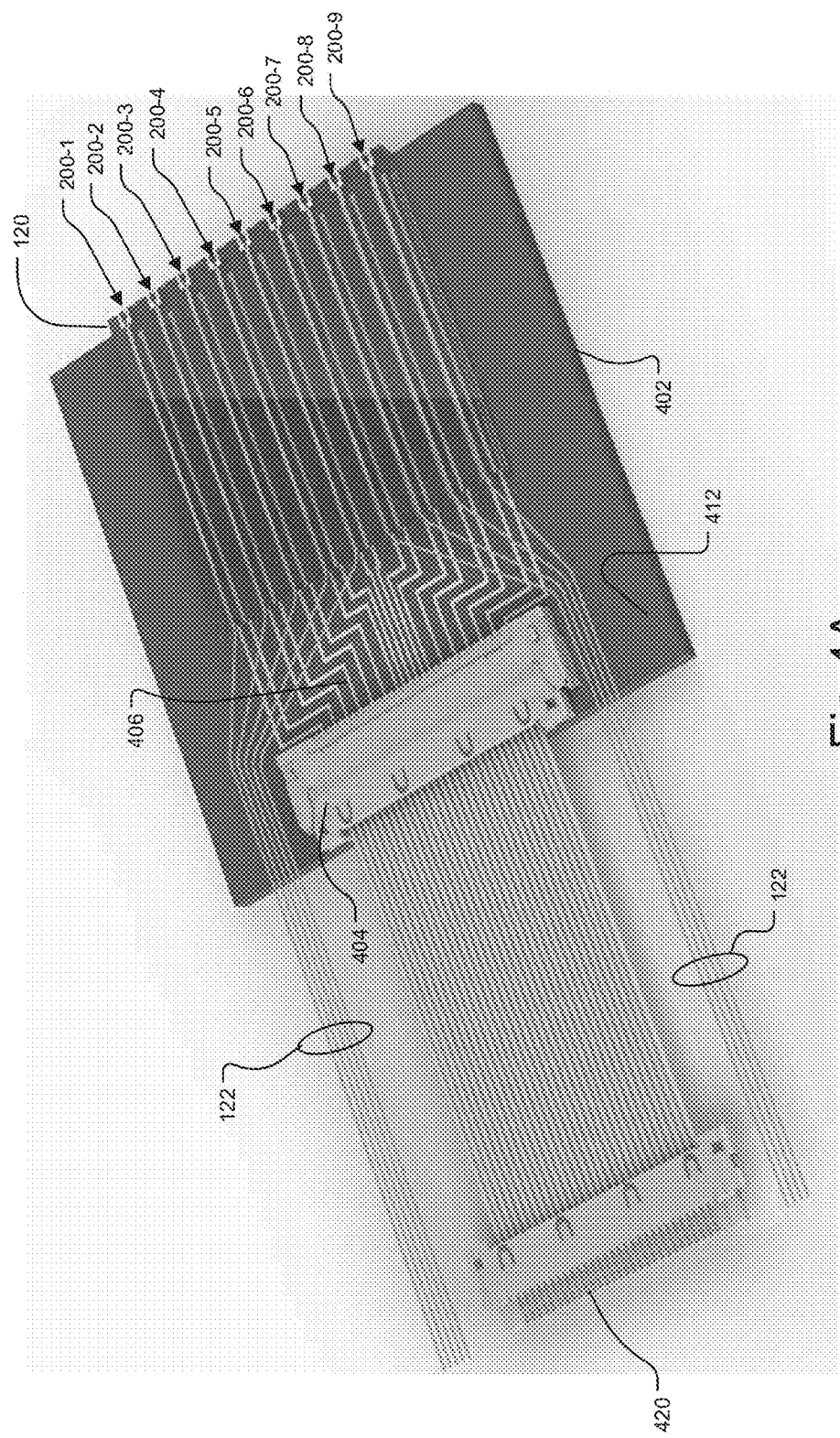
FIGS. 4A and 4B are a perspective view and an exploded perspective view of a projector module according to a related embodiment.
Figure 4B:
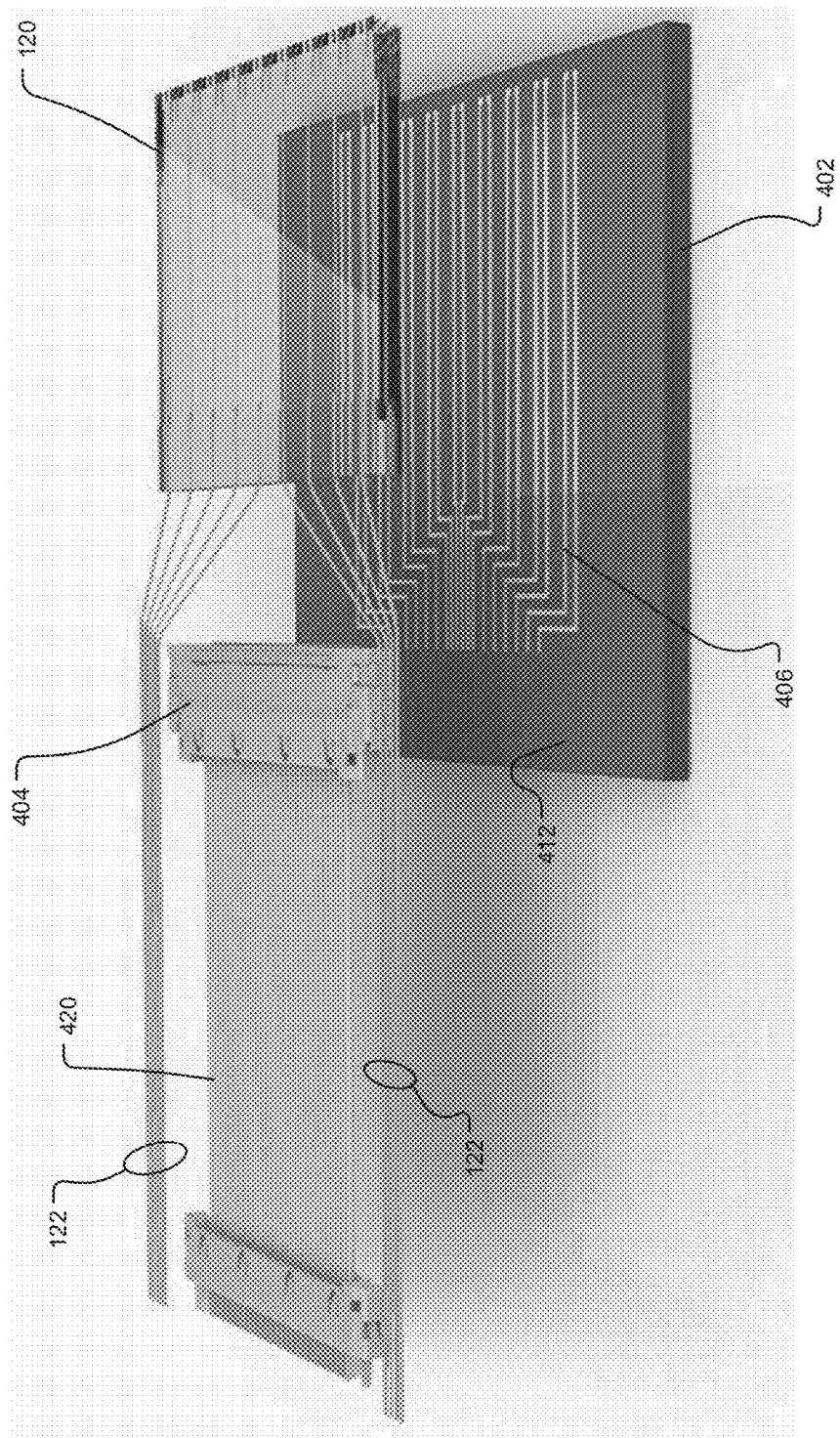

FIGS. 4A and 4B show a related embodiment of the projector module 400. It is generally similar to the projector module described with respect to FIGS. 1-3, but differs in a few ways.

Here, a single SAW substrate 120 is attached to the top of the module board 402, rather than two as depicted in FIG. 1. The substrate, however, is more highly integrated. It includes nine (9) SAW modulator devices 200-1 to 200-9.

More details are shown concerning the RF feed line network 406. The feedlines include an array of traces that run on or through the board and carry separate RF signals. In this way, the module board 402 has an array of RF feed lines 406 for providing RF signals to the substrates.

Also shown is a specific implementation of the module RF connector 404. A ribbon umbilical cable 420 plugs into a ribbon-style connector 404 as the module RF connector. The connector 404 is attached to the top face 412 of the module board 402.

The optical fibers 122 run into groups and connect to provide the optical signals to the separate SAW devices 200.

In other embodiments, however, the ribbon-style connector 404 is replaced with Pogo pins, press-fit, conductive adhesives, wire-bonding, or ZEBRA-brand (Fuji Polymer Industries) elastomeric connectors.

Figure 5:
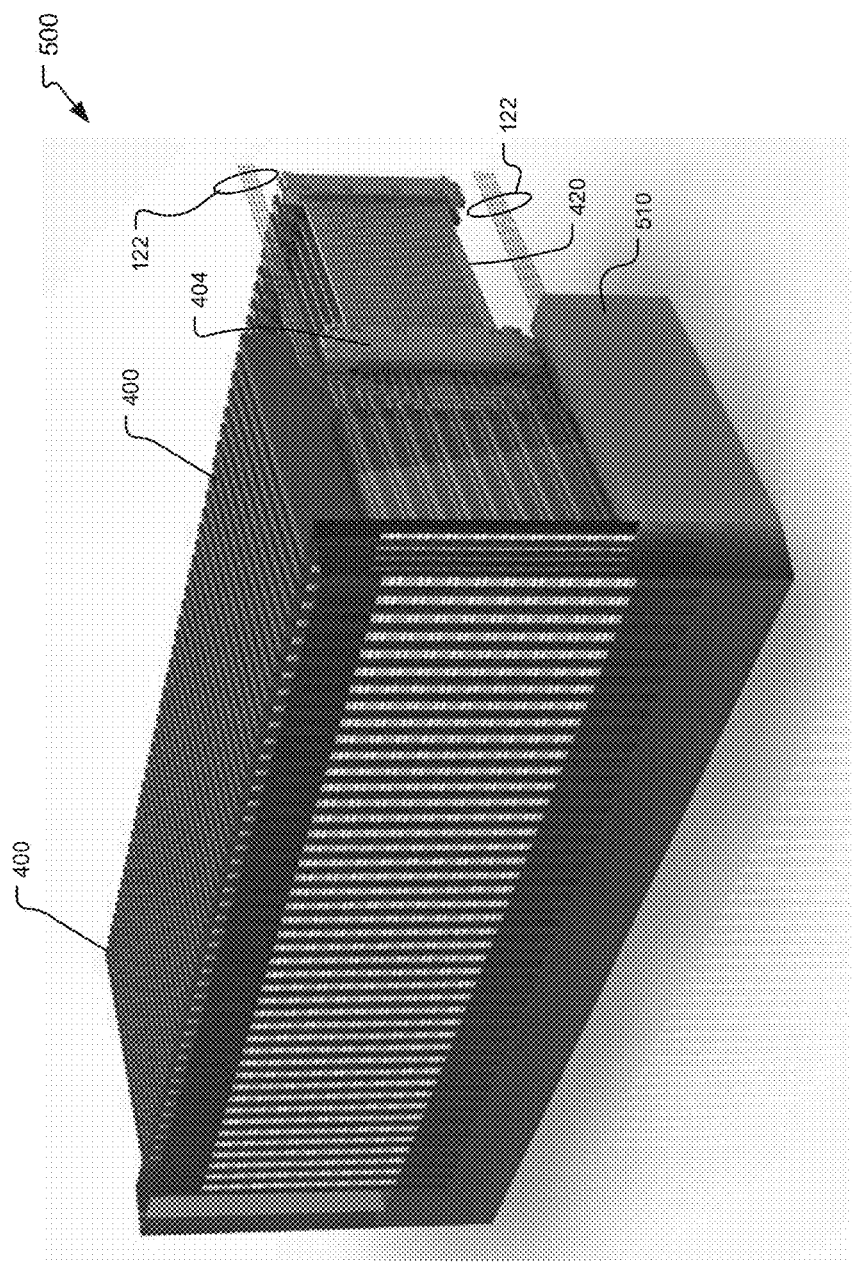
FIG. 5 is a perspective view of a projector system with a stack of projector modules.

FIG. 5 shows a light field generator system 500 including a stack of projector modules 400. The modules are held vertically by a common system mounting block 510. Specifically, 44 slots are provided in the mounting block 510 in the illustrated embodiment. Each of these slots receives a separate projector module 400.

Fabricating Conformal RF Traces 124A, 124B

The conformal RF traces 124A, 124B are preferably a region of conductive silver ink applied to or attached by direct press-fit to one or more PCB traces.

An alternative is transparent and conductive inks.

Since such conformal RF traces 124A, 124B are opaque to the optical wavelengths used in the light field projector module 300, the traces 124A/124B are applied so as to not block the diffracted light 162 exiting the substrate 120. In the illustrated examples provided herein, the traces 124A, 124B straddle the region of the end face 170 from which the light is emitted.

The conductive traces 124A, 124B may be applied by standard equipment, such as the Optomec (Albuquerque, N. Mex.) aerosol jet printers. The printer is used to deposit silver nano-flake ink, such as HPS-030AE1 from Novacentrix™ to create the one or more conductive traces from the "top" to the "bottom" of each modulator of the substrate 120.

A print head of such a printing system can be rotated to 45 degrees in order to provide ink coverage on the proximal, end, and distal faces of the substrate and also to enable edge coverage. The SAW substrate 120 was mounted with thermal release tape to a carrier after the printing on the distal and the end faces of the substrate so that the uncured ink would not contact the printing system's platen. The SAW substrate 120 can also be clamped in a fixture and held above the platen surface to avoid contacting uncured ink. Then the proximal face was printed. For example, the lines are approximately 200 micrometers wide and were deposited with several passes of the printhead.

Other alternatives are wire bonds from the modulator/substrate IDT 110 to the module board PCB 402.

Figure 6:
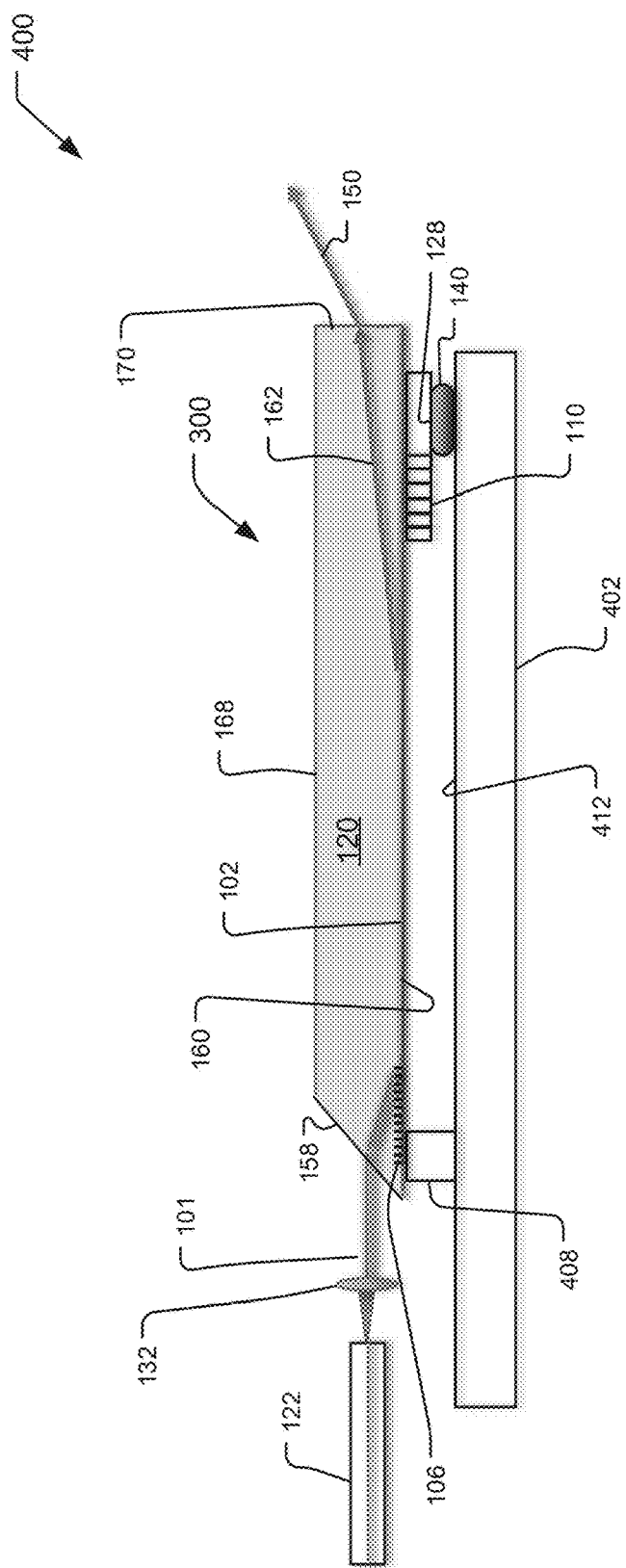
FIG. 6 is a side view of another exemplary projector module 400.

FIG. 6 shows a side view of another exemplary projector module 400.

This embodiment removes the need for conductive traces printed on the lithium niobate SAW substrate 120. The light field generator device 300 is installed with its proximal face 160 facing the module board 402. That is, the surface of the light field generator device 300 with waveguides 102, in-coupling devices 106, and IDTs 110 face the top face 412 of the module PCB 402.

Solder balls or conductive epoxy are used as the conductive blocks 410 to make contact between the IDT bond pads 128 and pads on the module board 402. Additionally, micropearls can be an alternative to solder balls.

In general, by controlling the tin-lead content of the solder balls, the reflow temperature can be tuned. This can be used to keep the solder balls more spherical to provide a desired standoff distance.

Input light 101 from optical fiber 122 is preferably fed through an end facet polished into the input end face 158 of the SAW substrate 120. One option is to use a collimated beam produced by sending the light 101 from the fiber 122 through a collimating optic 132. The input beam can be adjusted to the correct angle to couple into the waveguide 102 via the in-coupling grating 106 by angling the input end face 158 of the SAW substrate 120.

Rear standoff block 408 between the SAW substrate 120 and module PCB 402 ensure that the IDTs 110 and in-coupling grating 106 remain undamaged and that the SAW propagation in the waveguide 102 is not impeded by close contact of the PCB 402 and substrate 120.

Figure 7:
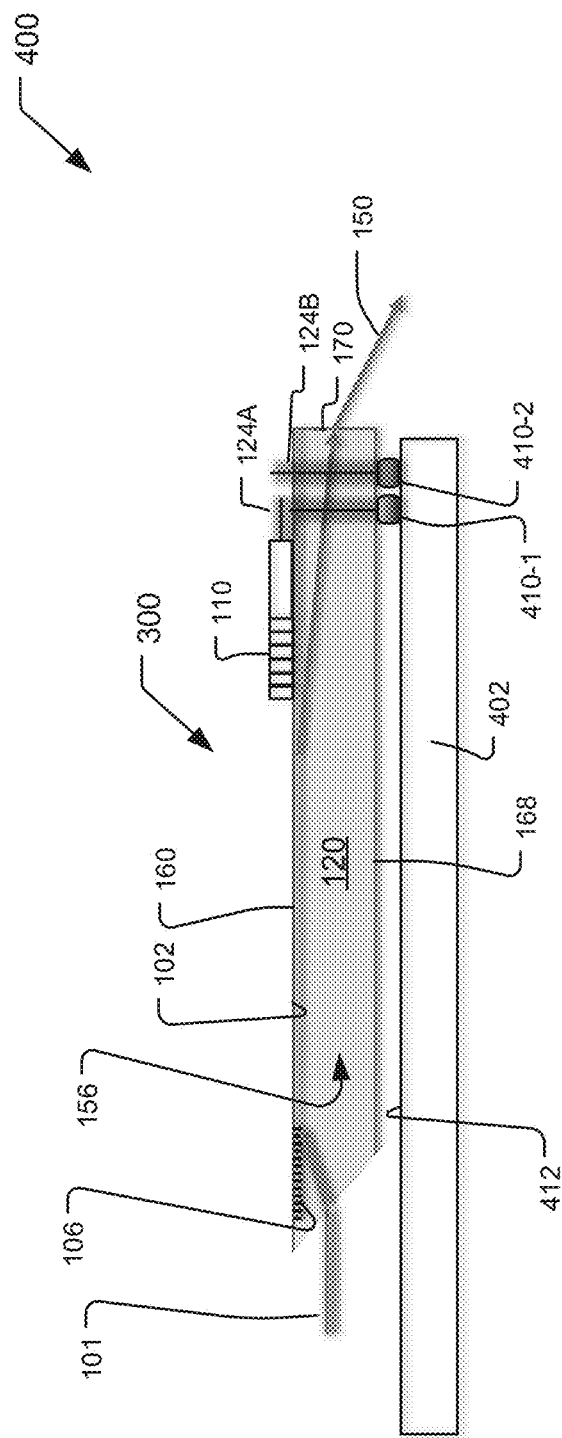
FIG. 7 is a side view of another exemplary projector module 400.

FIG. 7 shows a side view of another exemplary projector module 400.

Here, the RF traces 124A, 124B run on the side facets 154, 156 of the SAW substrate 120. These conductive traces can then be printed down both of the side facets 154, 156 of the SAW substrate 120 to extend directly to conductive blocks 410A, 410B on the module PCB 402.

Figure 8:
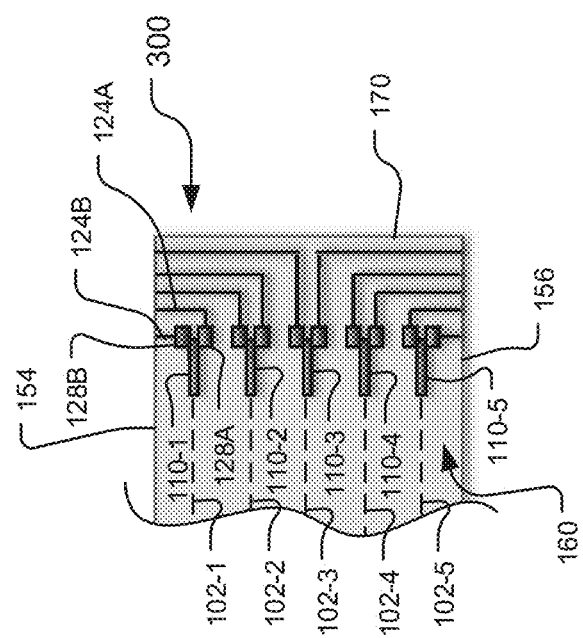
FIG. 8 shows a partial top view of the proximal side 160 of a light field generator device 300 with five (5) SAW devices.

FIG. 8 shows a partial top view of the proximal side 160 of a light field generator device 300 with five (5) SAW devices 102-1 to 102-5. Here printed or lithographically defined RF traces 124A, 124B run from the IDTs 110-1 to 110-5 of the SAW devices 102-1 to 102-5 and down both of the side facets 154, 156 of the SAW substrate 120.

While this invention has been particularly shown and described with references to preferred embodiments thereof, it will be understood by those skilled in the art that various changes in form and details may be made therein without departing from the scope of the invention encompassed by the appended claims.

What is claimed is:

1. A projector module, comprising:
   one or more surface acoustic wave (SAW) substrates, each having one or more SAW modulators including waveguides for transmitting light; and
   a module board carrying the one or more SAW substrates.

2. A module as claimed in claim 1, wherein the module board has an array of radio frequency (RF) feed lines for providing RF signals to the substrates.

3. A module as claimed in claim 1, further comprising standoff blocks for spacing the SAW substrates from the module board.

4. A module as claimed in claim 1, further comprising RF traces on the SAW substrates for electrically connecting SAW transducers to RF feedlines of the module board.

5. A module as claimed in claim 4, wherein each of the RF traces extend across several faces of the SAW substrates.

6. A module as claimed in claim 4, further comprising two RF traces for each SAW modulator of the SAW substrates.

7. A module as claimed in claim 1, wherein exit faces of the SAW substrates have an obtuse edge cut angle.

8. A module as claimed in claim 1, further comprising a cable connector on the module board for receiving RF signals for driving the SAW modulators of SAW substrates.

9. A module as claimed in claim 8, wherein the cable connector receives a ribbon cable.

10. A light field generator device, comprising
    a surface acoustic wave (SAW) substrate containing SAW modulators; and
    radio frequency (RF) traces extending across several faces of the SAW substrate to deliver RF signals to transducers of the SAW modulators.

11. A device as claimed in claim 10, wherein the RF traces conformally follow the profile of the faces of the SAW substrate.

12. A device as claimed in claim 10, wherein the RF traces extend from a distal face of the SAW substrate around edges to a proximal face of the SAW substrate.

13. A device as claimed in claim 10, wherein the RF traces extend from a distal face of the SAW substrate over an end face to a proximal face of the SAW substrate.

14. A device as claimed in claim 10, wherein the RF traces extend over at least one side face of the SAW substrate.

15. A device as claimed in claim 10, wherein an exit face of the SAW substrate has an obtuse edge cut angle.

16. A method for forming radio frequency (RF) traces on a surface acoustic wave (SAW) substrate, the method comprising:
    depositing the traces on the SAW substrate; and
    preventing the traces from stopping light from exiting the SAW substrate.

17. A method as claimed in claim 16, wherein the traces conformally follow the profile of the faces of the SAW substrate.

18. A method as claimed in claim 16, wherein the traces extend from a distal face of the SAW substrate around edges to a proximal face of the SAW substrate.

19. A method as claimed in claim 16, wherein the traces extend from a distal face of the SAW substrate over an end face to a proximal face of the SAW substrate.

20. A method as claimed in claim 16, wherein the traces extend over at least one side face of the SAW substrate.

21. A method as claimed in claim 16, further comprising polishing an obtuse edge cut angle into the SAW substrate.

22. A method as claimed in claim 16, further comprising polishing an angle into an input face of the SAW substrate.

* * * * *